(12) United States Patent
Buckley et al.

(10) Patent No.: US 11,158,629 B2
(45) Date of Patent: Oct. 26, 2021

(54) POLARIZATION CIRCUIT OF A POWER COMPONENT

(71) Applicant: Commissariat A L'Energie Atomique et aux Energies Alternatives, Paris (FR)

(72) Inventors: Julien Buckley, Grenoble (FR); Erwan Morvan, Grenoble (FR)

(73) Assignee: Commissariat A L'Energie Atomique et aux Energies Alternatives, Paris (FR)

( * ) Notice: Subject to any disclaimer, the term of this patent is extended or adjusted under 35 U.S.C. 154(b) by 86 days.

(21) Appl. No.: 16/667,977

(22) Filed: Oct. 30, 2019

(65) Prior Publication Data
US 2020/0168600 A1    May 28, 2020

(30) Foreign Application Priority Data

Oct. 31, 2018  (FR) ..................... 18 60122

(51) Int. Cl.
*H01L 27/06*     (2006.01)
*H01L 29/20*     (2006.01)
(Continued)

(52) U.S. Cl.
CPC ...... *H01L 27/0629* (2013.01); *H01L 27/0605* (2013.01); *H01L 29/2003* (2013.01);
(Continued)

(58) Field of Classification Search
CPC ............. H01L 27/0629; H01L 27/0605; H01L 29/66462; H01L 29/7783; H01L 29/66212; H01L 29/872
See application file for complete search history.

(56) References Cited

U.S. PATENT DOCUMENTS

2012/0217542 A1   8/2012 Morita
2020/0411677 A1*  12/2020 Then ................... H01L 27/0605

FOREIGN PATENT DOCUMENTS

EP     2 811 520 A1    12/2014

OTHER PUBLICATIONS

French Preliminary Search Report dated Jul. 15, 2019 in French Application 18 60122 filed on Oct. 31, 2018 (with English Translation of Categories of Cited Documents & Written Opinon).
(Continued)

*Primary Examiner* — Joseph C. Nicely
(74) *Attorney, Agent, or Firm* — Oblon, McClelland, Maier & Neustadt, L.L.P.

(57) ABSTRACT

The invention aims for a polarisation circuit of a power component comprising a capacitive dividing bridge and a resistive dividing bridge formed on the same substrate as the component. An additional electrode 1' in the front face 100 of the substrate makes it possible to adjust one of the capacitance values of the capacitive dividing bridge according to the other of the capacitance values coming from one of the electrodes of the power component. The sizing of this additional electrode furthermore makes it possible to obtain a leakage resistance contributing to the resistive dividing bridge.
Alternatively, two additional resistances R, R' formed in the front face of the substrate making it possible to obtain the resistive dividing bridge independently of the capacitive dividing bridge.

15 Claims, 5 Drawing Sheets

(51) Int. Cl.
  H01L 29/66    (2006.01)
  H01L 29/872   (2006.01)
  H01L 29/778   (2006.01)
(52) U.S. Cl.
  CPC .. *H01L 29/66462* (2013.01); *H01L 29/66212* (2013.01); *H01L 29/7783* (2013.01); *H01L 29/872* (2013.01)

(56) References Cited

OTHER PUBLICATIONS

Wespel, M., et al., "Trapping Effects at the Drain Edge in 600 V GaN—on—Si HEMTs", IEEE Transactions on Electron Devices, vol. 63, No. 2, Feb. 2016, 8 pages.

Croon, J.A., et al., "Impact of the backside potential on the current collapse of GaN SBDs and HEMTs", Proceedings of the 27th International Symposium on Power Semiconductor Devices & IC's, May 2015, 4 pages.

* cited by examiner

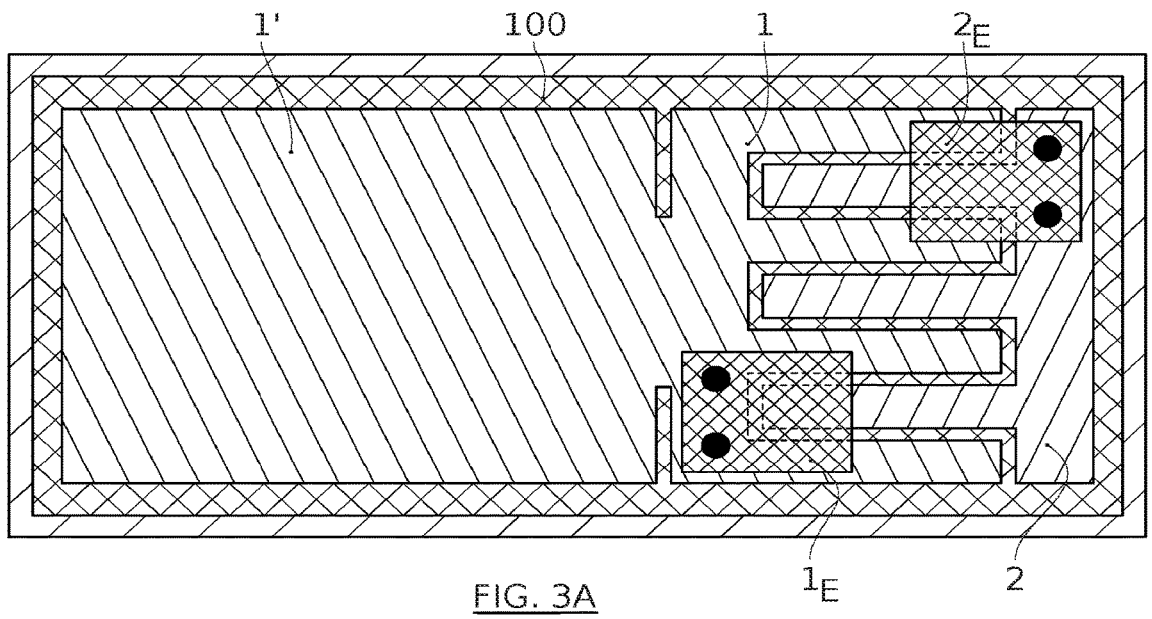
FIG. 3A
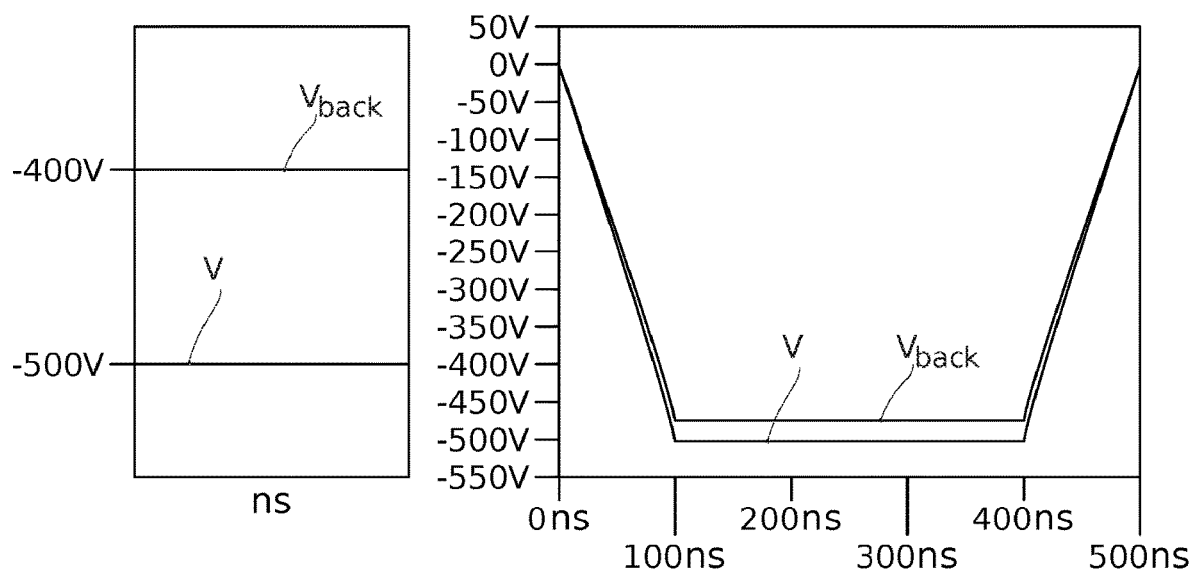
FIG. 3B
FIG. 3C

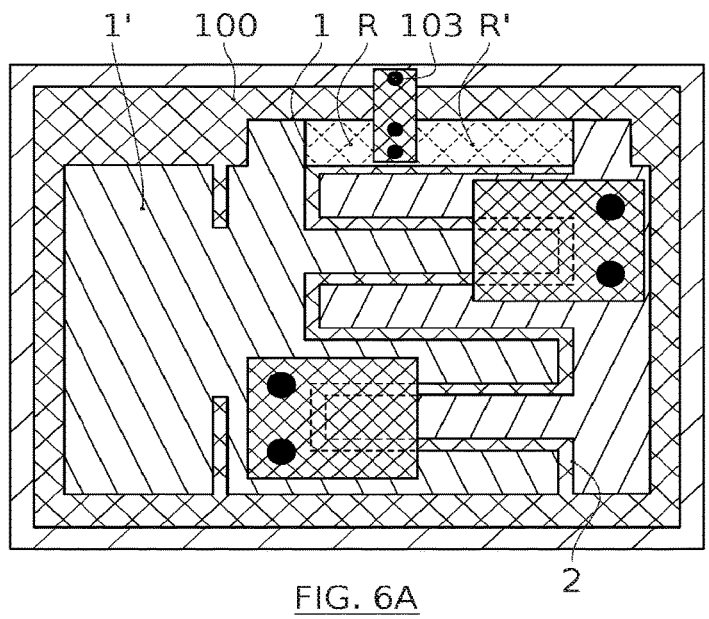
FIG. 6A
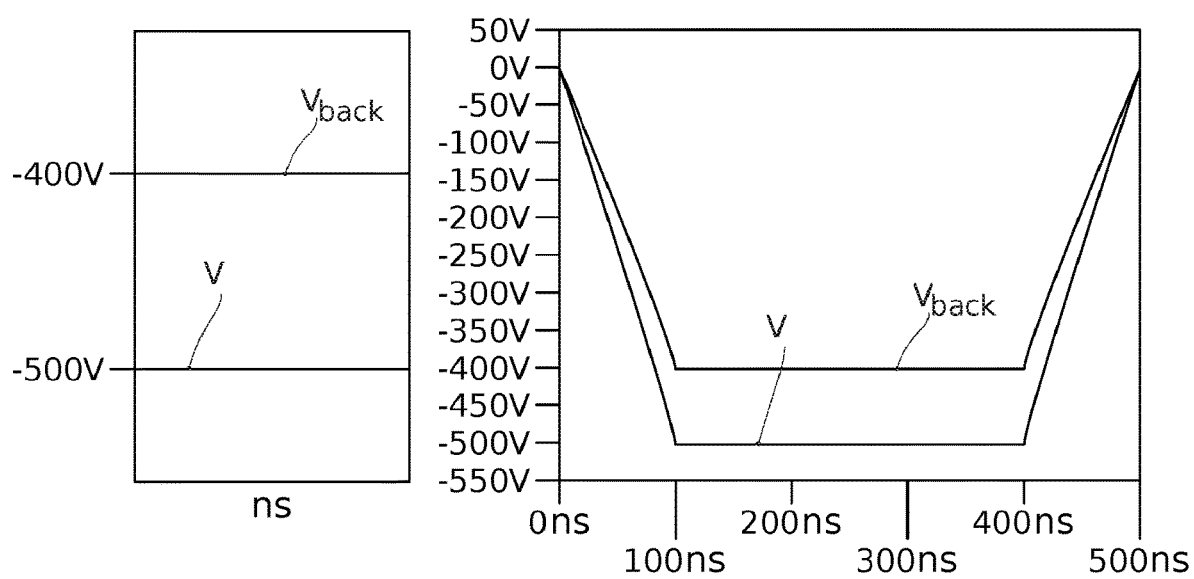
FIG. 6B
FIG. 6C

POLARIZATION CIRCUIT OF A POWER COMPONENT

TECHNICAL FIELD OF THE INVENTION

The invention relates to polarisation circuits for power components. It has at least one particularly advantageous application in the field of GaN-based Schottky diodes and GaN-based HEMT (High Electron Mobility Transistor)-type transistors.

STATE OF THE ART

Diodes and transistors are generally designed to function alternatively between a loop state and a blocked state.

The on-state makes it possible for the electric current to circulate between a first and a second electrode of these components, while the off-state stops the circulation of this current.

These components can be configured to function with high intensity currents and/or high polarisation voltages.

Such power components are generally GaN-based. For such GaN-based power components, the polarisation in the off-state can induce P trapping of negative charges in AlGaN and GaN layers, such as illustrated in FIGS. 1A and 1B. This P trapping thus limits the on-state current and degrades the features and the performances of these components in the on-state.

For a Schottky diode 11, such as that illustrated in FIG. 1A, this is conveyed in particular by an increase of the polarisation voltage in the on-state.

For a HEMT transistor 12, such as that illustrated in FIG. 1B, this is conveyed in particular by an increase in the resistance in the on-state.

For these components, it is thus necessary to limit the difference in potential between the first electrode and/or the second electrode and an underlying portion of the substrate, on the side of the rear face of this substrate.

An external polarisation circuit can make it possible to limit this difference in potential, and to thus reducing trapping.

A disadvantage of this solution is that such an external polarisation circuit induces additional space for the final component.

An aim of the present invention is to overcome at least partially some of the disadvantages mentioned above.

According to a specific aspect, an aim of the present invention is to provide a system comprising a power component and a polarisation circuit of the power component having a small footprint.

Another aim of the present invention is to propose a system comprising a power component and a polarisation circuit making it possible to obtain a substantially constant ratio between the potentials difference between the first and second electrodes and the potentials difference between the first electrode and the rear face of the substrate of the power component.

Other aims, features and advantages of the present invention will appear upon examining the following description and the supporting drawings. It is understood that other advantages can be incorporated.

SUMMARY OF THE INVENTION

To achieve this aim, a first aspect of the invention relates to a system comprising a power component and a polarisation circuit of said power component.

The power component is formed in the front face of a semi-conductive substrate having a front face and a rear face.

The power component has a loop state and a blocked state.

The power component comprises a first electrode having, in the on-state, an electric potential V1 and a second electrode having, in the on-state, an electric potential V2.

Advantageously, the polarisation circuit comprises a capacitive dividing bridge and a resistive dividing bridge formed at least partially on the semi-conductive substrate and configured to maintain in the rear face of the semi-conductive substrate, an electric potential Vback such that Vback is substantially equal to $k \cdot V$ with k a proportionality factor strictly between 0 and 1, and V being an operating voltage in the on-state of the component such that $V=V1-V2$.

The polarisation circuit is configured to limit on-state degradation of the power component. In particular, this degradation of operation is limited when load trapping is reduced.

According to the invention and particularly advantageously, the use of a capacitive dividing bridge makes it possible to keep the electrical potential Vback substantially constant during a dynamic blocking of the component.

Load trapping in the dynamic blocking situation of the component is subsequently reduced.

The use of a resistive dividing bridge makes it possible to keep the electrical potential Vback substantially constant during a static blocking of the component.

Load trapping in the static blocking situation of the component is subsequently reduced.

The formation of these dividing bridges directly on the semi-conductive substrate furthermore makes it possible to reduce the volume of such a polarisation circuit.

The first electrode of surface S1 forms with the rear face of the substrate, a first capacitor with capacitance C1 and leakage resistance R1.

The second electrode of surface S2 forms with the rear face of the substrate, a second capacitor with capacitance C2 and leakage resistance R2.

Advantageously, the polarisation circuit according to the present invention utilises these first and second capacitors to form at least partially the capacitive dividing bridge and/or the resistive dividing bridge.

The invention can have, optionally, at least any one of the following optional features which can be implemented in a separated or combined manner.

According to a preferred, but optional possibility, the formation of an additional electrode in the front face of the substrate makes it possible to obtain an additional planar capacitor. This additional electrode is preferably electrically connected to the first electrode and can thus be polarised to the potential V1. The additional capacitor thus has a capacitance C1' and a leakage resistance R1'.

The capacitor equivalent to the first capacitor and to the additional capacitor thus has a capacitance $C1eq=C1+C1'$ and a leakage resistance $R1eq=R1 \cdot R1'/(R1+R1')$.

The capacitive dividing bridge formed by the capacitances $C1eq$ and C2 thus makes it possible to control the potential Vback, as illustrated in FIG. 2.

To obtain $Vback=k \cdot (V1-V2)$, the capacitive dividing bridge is configured such that $C1eq=C2 \cdot k/(1-k)$. An advantageous possibility for such a configuration consists of sizing the additional electrode such that it has a surface S1' such that $S1'=S2 \cdot k/(1-k)-S1$.

The polarisation circuit according to the present invention can also utilise the first and second capacitors, and/or the additional capacitor to form at least partially the resistive dividing bridge.

In particular, the resistive dividing bridge formed by the leakage resistances R1$eq$ and R2 can make it possible to control the potential Vback, as illustrated in FIG. 2.

To optimise R1$eq$, a possibility consists of decreasing R1' by carrying out an etching of the front face of the semi-conductive substrate prior to the formation of the additional electrode. The substrate thickness between said additional electrode and the rear face of the substrate is thus decreased, thereby decreasing R1'.

According to a preferred, but optional possibility, the resistive dividing bridge comprises complementary resistors formed in the front face of the GaN-based substrate. These complementary resistors each advantageously comprise a series of alternate resistive elements, these resistive elements being formed by a metal element and an adjacent insulating zone. It is thus possible to precisely and easily calibrate the value of the resistances of these complementary resistors, by multiplying the number of resistive elements in series.

Such a resistor in the front face of a GaN-based substrate constitutes a separable aspect of the invention, and can be utilised independently from the polarisation circuit and from the system according to the first aspect of the invention.

In particular, according to this separable aspect of the invention, a resistor in the front face of a GaN-based substrate comprises a series of alternate resistive elements, each of these resistive elements comprising a metal element in the front face of the substrate bordered by an insulating zone in the GaN.

A method for forming such a resistor can comprise a step of forming a plurality of metal elements in the front face of the substrate, and a step of forming a plurality of insulating zones in the GaN, each of the insulating zones of said plurality of insulating zones bordering each of the metal elements of said plurality of metal elements.

According to a preferred possibility, the plurality of insulating zones is formed by a helium implantation in the GaN followed by an annealing.

BRIEF DESCRIPTION OF THE FIGURES

The aims, objectives, as well as the features and advantages of the invention will best emerge from the detailed description of embodiments of the latter which are illustrated by the following supporting drawings, wherein:

FIG. 3A shows a top view of a GaN-based Schottky diode equipped with a polarisation circuit according to a first embodiment of the present invention;

FIG. 3B shows the voltages V and Vback according to the simulation results in the static blocking situation for a GaN-based Schottky diode equipped with a polarisation circuit according to the first embodiment illustrated in FIG. 3A;

FIG. 3C shows the voltages V and Vback according to the simulation results in the dynamic blocking situation for a GaN-based Schottky diode equipped with a polarisation circuit according to the first embodiment illustrated in FIG. 3A;

FIG. 6A shows a top view of a GaN-based Schottky diode equipped with a polarisation circuit according to a fourth embodiment of the present invention;

FIG. 6B shows the voltages V and Vback according to the simulation results in the static blocking situation for a GaN-based Schottky diode equipped with a polarisation circuit according to the fourth embodiment illustrated in FIG. 6A;

FIG. 6C shows the voltages V and Vback according to the simulation result in the dynamic blocking situation for a GaN-based Schottky diode equipped with a polarisation circuit according to the fourth embodiment illustrated in FIG. 6A;

Figures 1A, 1B:
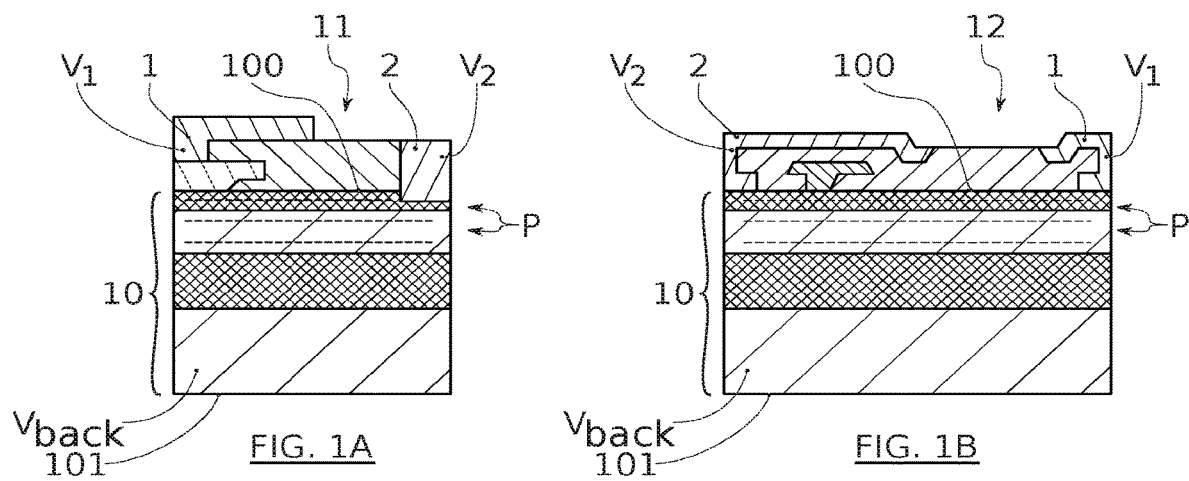
FIG. 1A shows a cross-sectional diagram of a GaN-based Schottky diode according to the prior art.
FIG. 1B shows a cross-sectional diagram of a GaN-based HEMT transistor according to the prior art.

The drawings are given as examples and are not limiting of the invention. They constitute principle schematic representations intended to facilitate the understanding of the invention and are not necessarily to the scale of practical applications.

In particular, the thicknesses and dimensions of the different layers and portions of the devices illustrated are not representative of reality.

DETAILED DESCRIPTION OF THE INVENTION

Before starting a detailed review of embodiments of the invention, it is reminded that the invention comprises, in particular, the optional features below which could be used in association or alternatively:

According to an embodiment, the capacitive dividing bridge comprises a first equivalent capacitor having a first equivalent capacitance C1$eq$ and a second equivalent capacitor having a second equivalent capacitance C2$eq$ such that $0.9 \cdot C2eq \cdot k/(1-k) \leq C1eq \leq 1.1 \cdot C2eq \cdot k/(1-k)$.

This makes it possible to maintain a polarisation voltage Vback in dynamic blocking such that: $0.9 \cdot k \cdot V \leq Vback \leq 1.1 \cdot k \cdot V$.

According to an embodiment, the resistive dividing bridge comprises a first equivalent resistor having a first equivalent resistance R1$eq$ and a second equivalent resistor having a second equivalent resistance R2$eq$ such that $0.9 \cdot R2eq \cdot (1-k)/k \leq R1eq \leq 1.1 \cdot R2eq \cdot (1-k)/k$.

This makes it possible to maintain a polarisation voltage Vback in static blocking such that: $0.9 \cdot k \cdot V \leq Vback \leq 1.1 \cdot k \cdot V$.

According to an embodiment, the first equivalent capacitor comprises a first capacitor and an additional capacitor, the first capacitor being formed by the substrate and the first electrode in the front face of the substrate, and having a first capacitance C1 between the rear face of the substrate and the first electrode, such that $C1 = E \cdot S1/e$ with S1 a surface of the first electrode, e being a nominal thickness of the substrate, and E being a permittivity of the substrate, and the additional capacitor being formed by the substrate and an additional electrode in the front face of the substrate electrically connected to the first electrode, and having an additional capacitance $C1'$ between the rear face of the substrate and the additional electrode, such that $C1'=E\ S1'/e$ with $S1'$ being a surface of the additional electrode, e being the nominal thickness of the substrate, and E being the permittivity of the substrate, such that the first equivalent capacitance $C1eq=C1+C1'$.

The dielectric permittivity E can be an average value between a permittivity value of a silicon substrate (Si) comprising nitride layers (GaN/AlN/AlGaN) on the surface and a permittivity value of an Si substrate without said layers. The nominal thickness e can be substantially equal to a thickness of the nitride layers on the surface of an Si substrate and a silicon thickness depleted from said Si substrate, in particular at the level of a static polarisation point of the substrate.

According to an embodiment, the second equivalent capacitor comprises a second capacitor formed by the substrate and the second electrode in the front face of the substrate, and having a second capacitance $C2$ between the rear face of the substrate and the second electrode, such that $C2=E\ S2/e$ with $S2$ being a surface of the second electrode, e being a nominal thickness of the substrate, and E being a permittivity of the substrate, such that the second equivalent capacitance $C2eq=C2$.

The two preceding embodiments make it possible to form the capacitive dividing bridge directly at the level of the component, partially on the same substrate as the component. This solution is simple to implement.

According to an embodiment, the first equivalent resistor comprises a first resistor and an additional resistor, the first resistor being formed by the substrate and the first electrode in the front face of the substrate, and having a first leakage resistance $R1$ between the rear face of the substrate and the first electrode, such that $R1=e/s\cdot S1$ with $S1$ being a surface of the first electrode, e being a nominal thickness of the substrate, and s being a conductivity of the substrate, and the additional resistor being formed by the substrate and an additional electrode in the front face of the substrate electrically connected to the first electrode, and having an additional leakage resistance $R1'$ between the rear face of the substrate and the additional electrode, such that $R1'=e/s\cdot S1'$ with $S1'$ being a surface of the additional electrode, e being the nominal thickness of the substrate, and s being the conductivity of the substrate, such that the first equivalent resistance $R1eq$ is such that $1/R1eq=1/R1+1/R1'$. The conductivity s of the substrate can in particular be taken at the level of a polarisation point between the first and second leakage resistances $R1$, $R1'$.

According to an embodiment, the second equivalent resistor comprises a second resistor formed by the substrate and the second electrode in the front face of the substrate, and having a second leakage resistance $R2$ between the rear face of the substrate and the second electrode, such that $R2=e/s\cdot S2$ with $S2$ being a surface of the second electrode, e being a nominal thickness of the substrate, and s being a conductivity of the substrate, such that the second equivalent resistance $R2eq=R2$.

The two preceding embodiments make it possible to form the resistive dividing bridge directly at the level of the component partially on the same substrate as the component. This solution is simple to implement.

According to an embodiment, the first and second electrodes each have fingers and are at least partially interdigital and the additional electrode is situated at the edge of the interdigitation zone.

This makes it possible to design an additional electrode according to need, for one same component design.

According to an embodiment, the substrate situated between the additional electrode in the front face and the rear face has a thickness $e'$ strictly less than the nominal thickness e of the substrate, such that the additional leakage resistance $R1'=e'/s\cdot S1'$ is decreased.

This makes it possible to optimise the additional leakage resistance $R1'$. This makes it possible, for example, to obtain an optimised pair $R1'$ and $C1'$, compatible with respectively a resistive dividing bridge and a capacitive dividing bridge having one same proportionality factor k.

According to an embodiment, the first and second electrodes each have fingers and are at least partially interdigital at the level of an interdigitation zone, and the additional electrode has additional fingers extending the fingers of the first electrode along a direction by width of said fingers, so as to form extended fingers having a width, strictly greater, preferably at least five times greater, than a width of the fingers of the second electrode.

This makes it possible to obtain a compact polarisation circuit, directly within the component.

According to an embodiment, the first equivalent resistor comprises a first complementary resistor formed in the front face of the substrate and having respectively a first complementary resistance R such that the first equivalent resistance $R1eq$ is such that $1/R1eq=1/R1+1/R1'+1/R$.

According to an embodiment, the second equivalent resistor comprises a second complementary resistor formed in the front face of the is substrate and having a second complementary resistance $R'$ such that the second equivalent resistance $R2eq$ is such that $1/R2eq=1/R2+1/R'$.

The two preceding embodiments make it possible to adjust more precisely the first and second equivalent resistances to form a resistive dividing bridge having the proportionality factor k.

This furthermore makes it possible to optimise the integration of these first and second complementary resistors during the formation of the component. In particular, certain steps of forming the component and of forming the complementary resistors can be common, which ultimately decreases the number of steps necessary to form the polarisation circuit.

According to an embodiment, the first and second complementary resistors each comprise a series of resistive elements, said resistive elements being formed by an alternate metal element and insulating zone.

This makes it possible to simply form the first and second complementary resistors, from standard technological microelectronic steps. This also makes it possible to precisely adjust the value of the complementary resistances R, R'.

According to an embodiment, the semi-conductive substrate comprises GaN in the front face and the insulating zone is formed by a helium implantation in the GaN followed by an annealing.

This makes it possible to obtain an ohmic behaviour of the complementary resistors.

According to an embodiment, the proportionality factor is selected such that $0.7 < k < 0.9$.

This makes it possible to limit the degradation of the functioning of the component in the on-state. This makes it possible, for example, to limit the polarisation voltage of a Schottky diode in the on-state. This makes it possible, for example, to limit the increase of the resistance in an HEMT transistor in the on-state.

According to an embodiment, the power component is taken from among a Schottky diode and an HEMT transistor.

According to an embodiment, the power component is gallium nitride (GaN)-based.

The invention according to the separable aspect thereof comprises, in particular, the optional features below, which could be used in association or alternatively:

According to an embodiment of the method for forming the resistor, the implantation of helium is done at a dose of around $5 \times 10^{14}/cm^2$.

According to an embodiment of the method for forming the resistor, the annealing is done at around 800° C.

In the present invention, by "HEMT-type transistors", this means high-mobility electron field-effect transistors, sometimes also designated by the term, heterostructure field-effect transistor. Such a transistor includes the superposition of two semi-conductive layers having different band gaps which form a quantic well at the interface thereof. Electrons are confined in this quantic well to form a two-dimensional electron gas. For reasons of high-voltage and temperature performance, the semi-conductive material of these transistors is selected so as to have a broad energy band gap.

Among broad energy band gap HEMT transistors, gallium nitride-based transistors are very promising.

It is specified that, in the scope of the present invention, the deposition of a first layer, for example made of AlGaN on a second layer, for example made of GaN, does not compulsorily mean that the two layers are directly in contact with one another, but means that the first layer covers at least partially the second layer by being either directly in contact with it, or by being separated from it by at least one other layer or at least one other element. For example, and in a manner known per se in the field of GaN-based HEMT transistors, a thin layer made of AlN can be inserted between two semi-conductive layers made of GaN and AlGaN.

By a substrate, a device, a material A "based" layer, this means a substrate, a device, a layer comprising this material A only or this material A and possibly other materials, for example alloy elements, impurities or doping elements, the material A having advantageous properties for the substrate, the device, or the layer. Thus, a gallium nitride (GaN)-based diode or transistor comprises an active portion made of GaN, with possibly doped portions, or portions made of AlGaN alloy, for example.

Below, the maintaining of a nominal value, for example a potential value in the rear face proportional to the functioning voltage of the component, means that this value does not have any significant variations over time, during which it is maintained. In particular, these variations are less than 10% of the value, preferably than 5% of the value.

Below, the terms "substantially", "around", "of around" mean "almost 10%".

It is specified, that in the scope of the present invention, the thickness of a layer or of the substrate is measured along a direction perpendicular to the surface according to which this layer or this substrate has the maximum extension thereof. In FIGS. 1A and 1B, the thickness is taken along the vertical.

In the present patent application, a resistor is a resistive dipole having an ohmic conductive behaviour, mainly characterised by the electric resistance thereof. It is also commonly called "resistance".

A capacitor is a capacitive dipole, mainly characterised by the electric capacitance thereof. In the present patent application, it is also commonly called "capacitance".

Below, the term "resistance" therefore refers either to the "resistor" component, or to the "electric resistance" physical property.

Below, the term "capacitance" therefore refers either to the "capacitor" component, or to the "electric capacitance" physical property.

According to the invention, a first embodiment of the polarisation circuit will now be described in reference to FIG. 3A.

In the description below, the power component integrating this polarisation circuit is a GaN-based Schottky diode without this being limiting. Indeed, the description below also applies to other power components, and in particular, to HEMT-type transistors.

The Schottky diode can comprise a first connection pad 1E connected to a first metal electrode 1 forming a first series of fingers, and comprising a second connection pad 2E connected to a second metal electrode 2 forming a second series of fingers.

The first and second electrodes 1, 2 are preferably formed in the front face 100 of the substrate 10.

The first and second series of fingers are preferably interdigital.

The first and second series of fingers preferably comprise substantially the same number of fingers, of between 15 and 50, for example.

The first and second series of fingers can comprise, for example, 26 fingers.

Each of these fingers can have a length of between 100 µm and 5 mm, for example of around 1 mm, and a width of between 3 µm and 50 µm, for example, of around 15 µm.

The fingers of the first series can have a length and/or a width equal respectively to the length and/or the width of the fingers of the second series.

Figure 2:
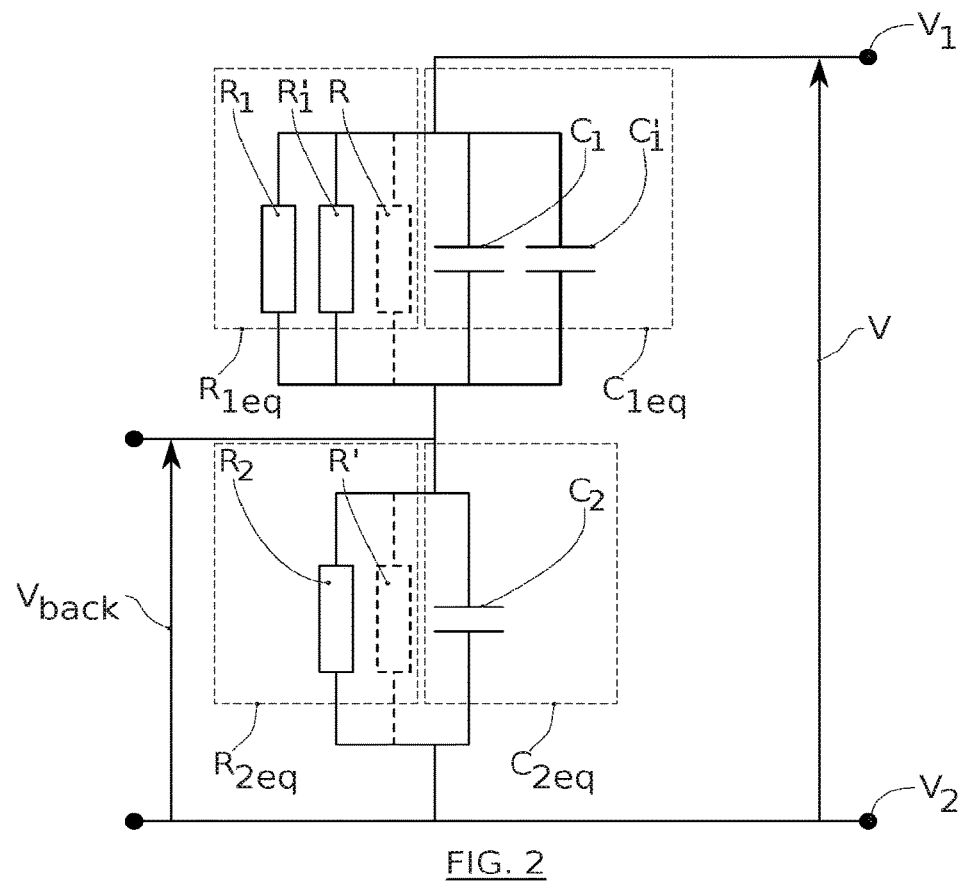
FIG. 2 shows a polarisation circuit according to an embodiment of the present invention.

Such as illustrated in FIG. 2, the polarisation circuit can advantageously comprise a capacitive dividing bridge comprising a first capacitance portion C1$eq$ and a second capacitance portion C2$eq$, such that Vback=V·C1$eq$/(C1$eq$+C2$eq$).

This capacitive dividing bridge makes it possible to maintain the substantially constant electric potential Vback during a dynamic blocking of the power component.

Subsequently, Vback=k·V with k being the proportionality factor of value k=C1$eq$/(C1$eq$+C2$eq$) in dynamic blocking.

The first portion of the capacitive dividing bridge of the polarisation circuit can advantageously be achieved by connecting an additional electrode 1' to the first electrode 1.

This additional electrode 1' is preferably formed I the front face 100 of the substrate. It can be formed advantageously, at the same time as the first electrode 1.

It is preferably formed by standard microelectronic methods, for example by a "lift off" method, or by an RIE (Reactive Ion Etching) dry etching method. This makes it possible to minimise the production costs of such a polarisation circuit.

Such an additional electrode 1' connected to the first electrode 1 in the front face 100 of the substrate forms, with the rear face 101 of the substrate, a first planar capacitor of equivalent capacitance $C1eq=C1+C1'$ where C1 is the capacitance formed between the rear face 101 of the substrate and the first electrode 1, and C1' is the capacitance formed between the rear face 101 and the additional electrode 1'.

In the case of the planar capacitor, $C1=E\ S1/e$ and $C1'=E\ S1'/e$ with S1 being the surface of the first electrode, S1' being the surface of the additional electrode 1', e being the thickness of the substrate taken between the front face 100 and the rear face 101, and E being the permittivity of the substrate. The surfaces are measured in a plane parallel to the plane wherein mainly extends the substrate 10. In FIG. 3A, this plane corresponds to the plane of the sheet. The thickness e of the substrate 10 is measured perpendicularly to the plane of the sheet.

The second portion of the capacitive dividing bridge of the polarisation circuit can advantageously be formed by the second electrode 2.

This second electrode 2 in the front face 100 of the substrate 10 forms with the rear face 101 of the substrate, a second planar capacitor of equivalent capacitance $C2eq=C2$.

In the case of the planar capacitor, $C2=E\ S2/e$ with S2 being the surface of the second electrode, e being the thickness of the substrate 10 taken between the front face 100 and the rear face 101, and E being the permittivity of the substrate 10.

The surfaces S1, S2 of the first and second electrodes 1, 2 can be substantially equal.

The surface S1' of the additional electrode 1' can therefore be advantageously sized so as to obtain the desired capacitance C1eq.

In particular, C1eq can be selected such that k=0.8. This makes it possible to improve the voltage performance of the power component in dynamic blocking.

Such as illustrated in FIG. 2, the polarisation circuit can advantageously comprise a resistive dividing bridge comprising a first portion of resistance R1eq and a second portion of resistance R2eq, such that $Vback=V \cdot R2eq/(R1eq+R2eq)$.

This resistive dividing bridge makes it possible to maintain the substantially constant electric potential Vback during a static blocking of the power component.

Subsequently, $Vback=k \cdot V$ with k being the proportionality factor of value $k=R2eq/(R1eq+R2eq)$ in static blocking.

The first portion of the resistive dividing bridge of the polarisation circuit can advantageously be formed from current leakages of the first planar capacitor.

This first planar capacitor indeed has a first equivalent resistance R1eq such that $1/R1eq=1/R1+1/R1'$ where R1 is the first leakage resistance between the first electrode 1 in the front face 100 and the rear face 101 of the substrate, and R1' is the additional leakage resistance between the additional electrode 1' in the front face 100 and the rear face 101 of the substrate 10.

In the case of the planar capacitor, $R1=e/s \cdot S1$ and $R1'=e/s \cdot S1'$ with S1 being the surface of the first electrode 1, S1' being the surface of the additional electrode 1', e being the thickness of the substrate 10 taken between the front face 100 and the rear face 101, and s being the conductivity of the substrate 10.

The second portion of the resistive dividing bridge of the polarisation circuit can advantageously be formed from current leakages of the second planar capacitor.

This second planar capacitor indeed has a second equivalent resistance $R2eq=R2$.

In the case of the planar capacitor, $R2=e/s \cdot S2$ with S2 being the surface of the second electrode 2, e being the thickness of the substrate 10 taken between the front face 100 and the rear face 101, and s being the conductivity of the substrate 10.

The surfaces S1, S2 of the first and second electrodes 1, 2 can be substantially equal.

The surface S1' of the additional electrode 1' can therefore be advantageously sized so as to obtain the desired resistance R1eq.

In particular, R1eq can be selected such that k=0.8. This makes it possible to improve the voltage performance of the power component in static blocking.

According to this example, the addition of one single additional electrode 1' makes it possible to both form a capacitive dividing bridge and a resistive dividing bridge. The design of the polarisation circuit is therefore simplified. The production of the polarisation circuit furthermore requires not very many technological steps. The cost of this production is thus decreased.

According to this example, the sizing of the additional electrode 1' favours the voltage performance of the power component in static blocking. The surface S1' is thus of around 3.8 mm$^2$.

A simulation of the voltage Vback obtained in the static blocking situation, on the one hand, and in the dynamic blocking situation, on the other hand, is illustrated in FIGS. 3B and 3C.

The voltage Vback thus obtained in the static blocking situation is −400V for a voltage V=−500V (FIG. 3B). The proportionality factor k equals 0.8 in static blocking.

The voltage Vback thus obtained in the dynamic blocking situation is −475V for a voltage V=−500V (FIG. 3C).

Other embodiments of the polarisation circuit according to the invention can be considered. Only the separate features of the first embodiment are described below, the other features not described being considered as identical to those of the first embodiment. Likewise, the technical advantages mentioned for the embodiment of FIGS. 3A to 3C, are, unless otherwise specified, applicable to the following embodiments.

Figure 4:
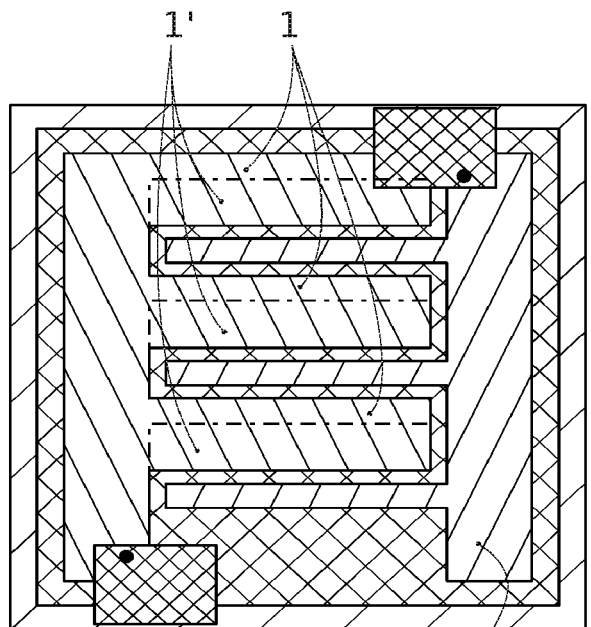
FIG. 4 shows a top view of a GaN-based Schottky diode equipped with a polarisation circuit according to a second embodiment of the present invention.

According to a second embodiment illustrated in FIG. 4, the surface S1' of the additional electrode 1' can be directly distributed at the level of the fingers of the first series of fingers.

The additional electrode 1' is subsequently presented in the form of additional fingers in the continuity of the fingers of the first series of fingers of the first electrode 1.

In particular, each finger of this first series of fingers of the first electrode 1 can be extended such that the initial surface S1 of the first electrode 1 becomes the total surface S1+S1'.

The additional electrode 1' and the first electrode 1 can therefore form one single and same electrode comprising one single series of extended fingers, each of these extended fingers comprising a finger of the first electrode 1 and an additional finger of the additional electrode 1'. Each finger of the first electrode 1 is thus adjacent to an additional finger of the additional electrode 1'. Preferably, there is no discontinuity of material between a finger of the first electrode 1 and an additional finger of the additional electrode 1'.

For example, the width of each extended finger, formed by the association of the first electrode 1 and of the additional electrode 1', is greater than or equal to 2, and preferably 5 times greater, the width of the fingers of the second electrode 2.

The width of the fingers is measured along a direction contained in the plane of the substrate and perpendicular to a direction along which the fingers mainly extend.

The capacitive and resistive dividing bridges can be formed in the same manner as in the first embodiment.

For example, to distribute the surface S1' of around 3.8 mm$^2$ over all of the 26 fingers of the first series of fingers, the fingers initially having a width of 15 µm and a width of 1 mm can each be extended by around 146 µm. The final width thereof is thus around 161 µm.

For another sizing of the surface S1' of around 1 mm$^2$, the fingers initially having a width of 15 µm and a length of 1 mm can each be extended by around 35 µm. The final width thereof is thus around 50 µm.

This second embodiment makes it possible to directly integrate the polarisation circuit within the power component. This makes it possible to implant, more easily, this component and/or to increase the compactness of this component.

Figure 5:
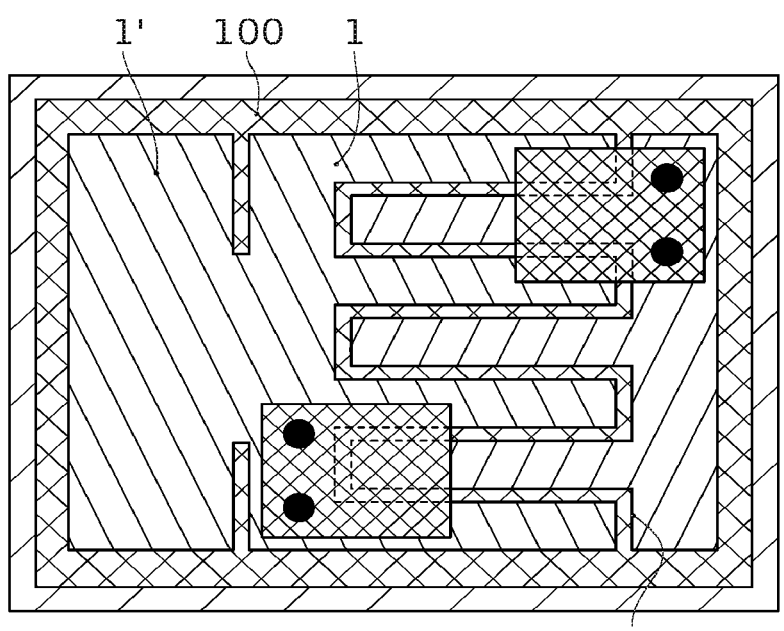
FIG. 5 shows a top view of a GaN-based Schottky diode equipped with a polarisation circuit according to a third embodiment of the present invention.

According to a third embodiment illustrated in FIG. 5, the substrate can be etched prior to the formation of the additional electrode 1', so as to decrease the thickness e' of the substrate under the additional electrode 1', between the front face 100 and the rear face 101.

The etching is preferably an etching of the GaN-based layers in the front face 100 of the substrate.

The additional resistance R1'=e'/s·S1' can thus be advantageously decreased.

Such an embodiment makes it possible to limit, even remove, the disparity between the voltage Vback in the static blocking situation and the voltage Vback in the dynamic blocking situation.

The etching depth is preferably selected in order to adjust the resistance R1' according to the surface S1' of the additional electrode 1', so as to optimise both the resistive dividing bridge and the capacitive dividing bridge.

A semi-empirical method making it possible to size the etching depth necessary according to the surface S1' of the additional electrode 1' preferably comprises the following steps:

Determining the desired voltage Vback from the best feature of the component in loop mode following the blocking of said component, for different voltages Vback. The desired voltage Vback value corresponds to that which degrades the least, the feature of the component in loop mode.

Calculating the desired capacitance C1' and resistance R1' values, making it possible to reach the desired voltage Vback to optimise the difference in voltage V−Vback between the first and second electrodes 1, 2 in the front face 100 and the rear face 101, Producing different additional electrodes for given S1' and for different etching depths of the GaN, Measuring the different values of the capacitances C1' and of the resistances R1' for each of the different additional electrodes according to the etching depth, Determining the etching depth for which the capacitance/resistance pairs correspond substantially to the values calculated.

According to a fourth embodiment illustrated in FIGS. 2 and 6A, the capacitive dividing bridge is formed by the additional electrode 1' and the resistive dividing bridge is formed by a first additional resistance R and a second additional resistance R'.

The capacitive and resistive dividing bridges can thus be formed independently.

The first additional resistance R is preferably connected between the first electrode 1 and the rear face 101 of the substrate.

The second additional resistance R' is preferably connected between the second electrode 2 and the rear face 101 of the substrate.

The connection 103 towards the rear face 101 can be achieved through the casing moulded around the chip comprising the power component, for example by $O_2/CF_4$ reactive plasma etching.

According to this example, the first equivalent resistance R1eq is such that 1/R1eq=1/R1+1/R1'+1/R and the second equivalent resistance R2eq is such that 1/R2eq=1/R2+1/R'.

Such an embodiment therefore makes it possible to precisely adjust the capacitance values C1eq, C2eq on the one hand, and the resistance values R1eq, R2eq on the other hand.

In particular, the surface S1' of the additional electrode 1' can be reduced so as to obtain the desired capacitance C1eq, independently of the desired resistance R1eq.

In this embodiment, the surface S1' can be, for example, around 1 mm$^2$, and the first and second additional resistances R and R' can be respectively equal to around 87 MOhm and around 350 MOhm.

For such a sizing, FIG. 6B shows the voltage Vback obtained by simulation in the static blocking situation for a voltage V=−500V. In this case, Vback is −400V.

FIG. 6C shows the voltage Vback obtained by simulation in the dynamic blocking situation for a voltage V=−500V. In this case, Vback is also −400V.

Such an embodiment therefore makes it possible to remove the disparity between the voltage Vback in the static blocking situation and the voltage Vback in the dynamic blocking situation.

According to a separable aspect of the invention, the first and second additional resistances R and R' can be produced from a localised helium implantation in the GaN-based layer(s) in the front face 100 of the substrate 10.

An annealing step consecutive to the helium implantation makes it possible to create a resistive zone having an ohmic behaviour.

In particular, a helium implantation with a dose of around $5 \times 10^{14}$/cm$^2$ followed by an annealing at around 800° C. makes it possible to obtain such an ohmic behaviour for a resistivity value of around 1.46 MOhm·mm.

Figure 7:
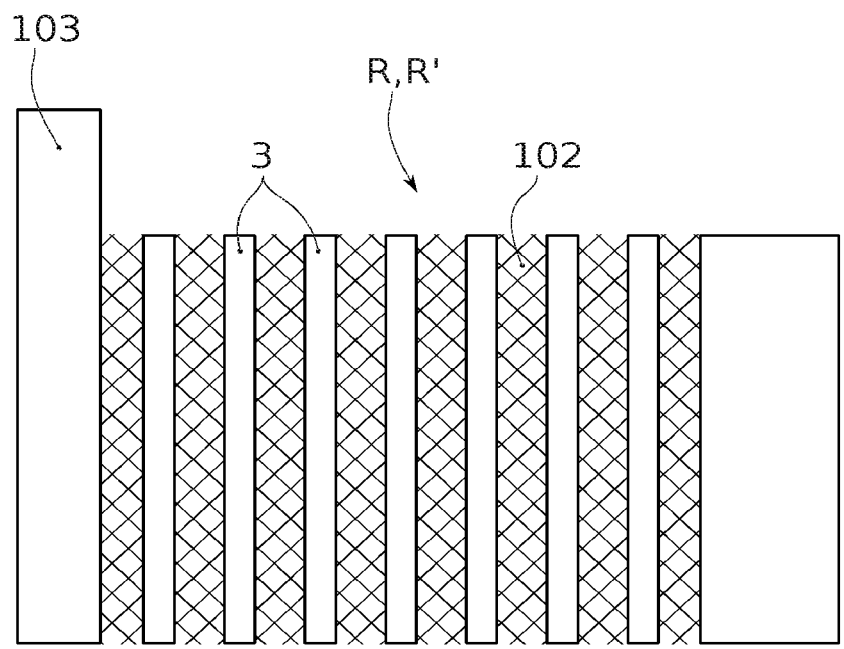
FIG. 7 illustrates, as a top view, an additional resistance according to an embodiment of the present invention.

Such as illustrated in FIG. 7, the first and second additional resistances R and R' are preferably produced in the front face 100 of the substrate on a resistive zone 102 formed by a first helium implantation step followed by a second annealing step.

Metal elements 3 are then deposited on this resistive zone so as to obtain the desired resistance value.

For example, twelve metal elements 3 each having a length of 200 µm and a width of 7 µm can be regularly arranged on the resistive zone 102 along a direction in width and spaced by 9 µm so as to form a first additional resistance R of a value of around 87 MOhm.

Forty-eight metal elements 3 each having a length of 200 µm and a width of 7 µm can be regularly arranged on the resistive zone 102 along the direction in width and spaced by 9 µm so as to form a second additional resistance R' of a value of around 350 MOhm.

Figure 8:
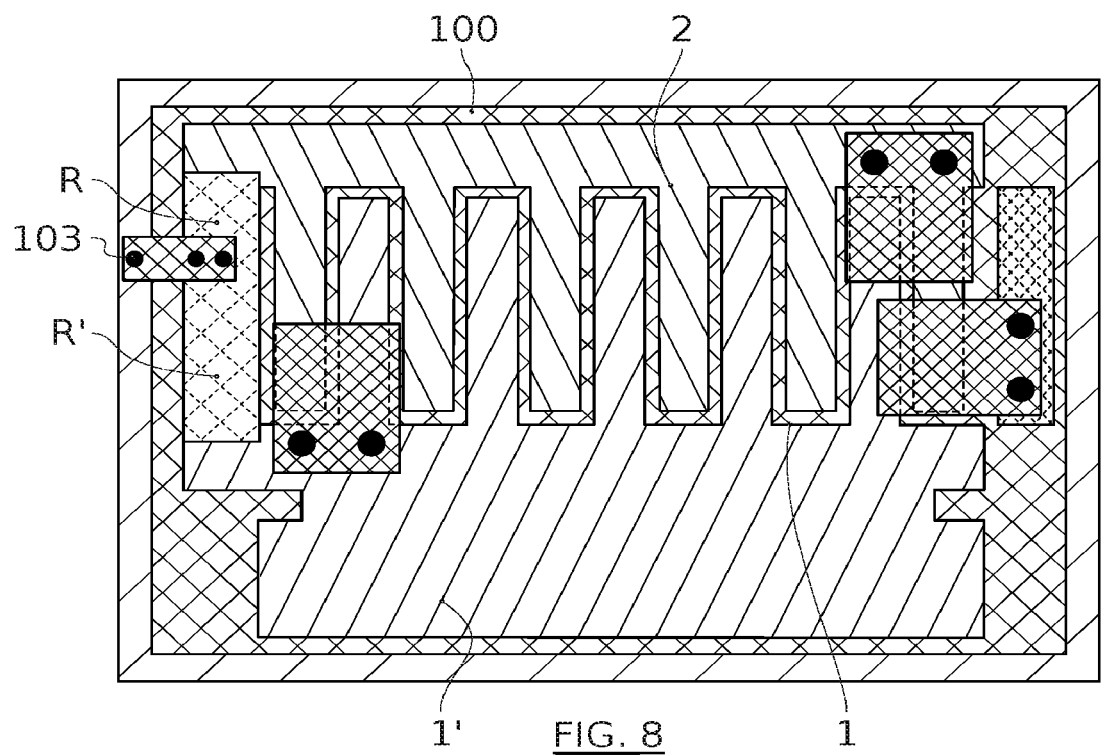
FIG. 8 shows a top view of a GaN-based HEMT transistor equipped with a polarisation circuit according to an embodiment of the present invention.

According to an embodiment illustrated in FIG. 8, the power component can be a GaN-based HEMT transistor.

According to this preferred embodiment, the capacitive and resistive dividing bridges are formed independently.

The capacitive dividing bridge is formed by the additional electrode 1' and the resistive dividing bridge is formed by the first and second additional resistances R and R'.

The sizing of the capacitive and resistive dividing bridges of the polarisation circuit of the GaN-based HEMT transistor can be done mutatis mutandis from that of the capacitive and resistive dividing bridges of the polarisation circuit of the GaN-based Schottky diode.

The invention is not limited to the embodiments described above and extends to all embodiments covered by the claims.

The invention claimed is:

1. A system comprising:
a power component having an on-state and an off-state; and
a polarisation circuit of said power component,
said power component being formed in a front face of a semi-conductive substrate, the semi-conductive substrate having the front face and a rear face and comprising a first electrode having, in the on-state, an electric potential V1 and a second electrode having, in the on-state, an electric potential V2,
wherein the polarisation circuit comprises a capacitive dividing bridge and a resistive dividing bridge formed at least partially on said semi-conductive substrate and configured to maintain in the rear face of the semi-conductive substrate, an electric potential Vback such that Vback is substantially equal to k·V with k being a proportionality factor strictly between 0 and 1, and V being an operating voltage in the on-state of the power component, such that V=V1−V2.

2. The system according to claim 1, wherein the capacitive dividing bridge comprises a first equivalent capacitor having a first equivalent capacitance C1$eq$ and a second equivalent capacitor having a second equivalent capacitance C2$eq$ such that 0.9·C2$eq$·k/(1−k)≤C1$eq$≤1.1·C2$eq$·k/(1−k), and wherein the resistive dividing bridge comprises a first equivalent resistor having a first equivalent resistance R1$eq$ and a second equivalent resistor having a second equivalent resistance R2$eq$ such that 0.9·R2$eq$·(1−k)/k≤R1$eq$≤1.1·R2$eq$·(1−k)/k.

3. The system according to claim 2, wherein the first equivalent capacitor comprises a first capacitor and an additional capacitor, the first capacitor being formed by the semi-conductive substrate and the first electrode in the front face of the semi-conductive substrate, and having a first capacitance C1 between the rear face of the semi-conductive substrate and the first electrode, such that C1=E S1/e with S1 being a surface of the first electrode, e being a nominal thickness of the semi-conductive substrate, and E being a permittivity of the semi-conductive substrate, and the additional capacitor being formed by the semi-conductive substrate and an additional electrode in the front face of the semi-conductive substrate electrically connected to the first electrode, and having an additional capacitance C1' between the rear face of the semi-conductive substrate and the additional electrode, such that C1'=E S1'/e with S1' being a surface of the additional electrode, e being the nominal thickness of the semi-conductive substrate, and E being the permittivity of the semi-conductive substrate, such that the first equivalent capacitance C1$eq$=C1+C1'.

4. The system according to claim 3, wherein the first equivalent resistor comprises a first complementary resistor formed in the front face of the semi-conductive substrate and the second equivalent resistor comprises a second complementary resistor formed in the front face of the semi-conductive substrate, said first and second complementary resistors having respectively a first complementary resistance R and a second complementary resistance R' such that the first equivalent resistance R1$eq$ is such that 1/R1$eq$=1/R1+1/R1'+1/R and the second equivalent resistance R2$eq$ is such that 1/R2$eq$=1/R2+1/R'.

5. The system according to claim 4, wherein the first and second complementary resistors each comprises a series of resistive elements, said resistive elements being formed by an alternate metal element and insulating zone.

6. The system according to claim 5, wherein the semi-conductive substrate comprises gallium nitride (GaN) in the front face and wherein the insulating zone is formed by a helium (He) implantation in the GaN followed by an annealing.

7. The system according to claim 3, wherein the first and second electrodes each have fingers and are at least partially interdigital at a level of an interdigitation zone and the additional electrode is situated at an edge of the interdigitation zone.

8. The system according to claim 3, wherein the first and second electrodes each have fingers and are at least partially interdigital at a level of an interdigitation zone, and the additional electrode has additional fingers extending the fingers of the first electrode along a direction in width of said fingers, so as to form extended fingers having a width strictly greater than, preferably at least five times greater than, a width of the fingers of the second electrode.

9. The system according to claim 2, wherein the second equivalent capacitor comprises a second capacitor formed by the semi-conductive substrate and the second electrode in the front face of the semi-conductive substrate, and having a second capacitance C2 between the rear face of the semi-conductive substrate and the second electrode, such that C2=E S2/e with S2 being a surface of the second electrode, e being a nominal thickness of the semi-conductive substrate, and E being a permittivity of the semi-conductive substrate, such that the second equivalent capacitance C2$eq$=C2.

10. The system according to claim 2, wherein the first equivalent resistor comprises a first resistor and an additional resistor, the first resistor being formed by the semi-conductive substrate and the first electrode in the front face of the semi-conductive substrate, and having a first leakage resistance R1 between the rear face of the semi-conductive substrate and the first electrode, such that R1=e/s·S1 with S1 being a surface of the first electrode, e being a nominal thickness of the semi-conductive substrate, and s being a conductivity of the semi-conductive substrate, and the additional resistor being formed by the semi-conductive substrate and an additional electrode in the front face of the semi-conductive substrate electrically connected to the first electrode, and having an additional leakage resistance R1' between the rear face of the semi-conductive substrate and the additional electrode, such that R1'=e/s·S1' with S1' being a surface of the additional electrode, e being the nominal thickness of the semi-conductive substrate, and s being the conductivity of the semi-conductive substrate, such that the first equivalent resistance R1$eq$ is such that 1/R1$eq$=1/R1+1/R1'.

11. The system according to claim 10, wherein the semi-conductive substrate situated between the additional electrode in the front face and the rear face has a thickness e' strictly less than the nominal thickness e of the semi-conductive substrate, such that the additional leakage resistance R1'=e'/s·S1' is decreased.

12. The system according to claim 2, wherein the second equivalent resistor comprises a second resistor formed by the semi-conductive substrate and the second electrode in the front face of the semi-conductive substrate, and having a second leakage resistance R2 between the rear face of the semi-conductive substrate and the second electrode, such that $R2=e/s \cdot S2$ with S2 being a surface of the second electrode, e being a nominal thickness of the semi-conductive substrate, and s being a conductivity of the semi-conductive substrate, such that the second equivalent resistance $R2eq=R2$.

13. The system according to claim 1, wherein the proportionality factor k is selected such that $0.7<k<0.9$.

14. The system according to claim 1, wherein the power component is one of a Schottky diode and an HEMT transistor.

15. The system according to claim 1, wherein the power component is GaN-based.

\* \* \* \* \*